US 8,578,324 B2

(12) United States Patent
Hartman et al.

(10) Patent No.: US 8,578,324 B2
(45) Date of Patent: Nov. 5, 2013

(54) VARIABILITY LAYER FOR DOMAIN-SPECIFIC MODELING LANGUAGES

(75) Inventors: Alan Hartman, Haifa (IL); Julia Rubin, Haifa (IL); Tal Haham, Misgav (IL)

(73) Assignee: International Business Machines Corporation, Armonk, NY (US)

( * ) Notice: Subject to any disclaimer, the term of this patent is extended or adjusted under 35 U.S.C. 154(b) by 1381 days.

(21) Appl. No.: 12/049,396

(22) Filed: Mar. 17, 2008

(65) Prior Publication Data

US 2009/0235227 A1    Sep. 17, 2009

(51) Int. Cl.
*G06F 9/44* (2006.01)

(52) U.S. Cl.
USPC .......................................... 717/104; 717/105

(58) Field of Classification Search
None
See application file for complete search history.

(56) References Cited

U.S. PATENT DOCUMENTS

| | | | | |
|---|---|---|---|---|
| 7,089,534 | B2* | 8/2006 | Hartman et al. | 717/125 |
| 7,117,484 | B2* | 10/2006 | Hartman et al. | 717/126 |
| 7,543,269 | B2* | 6/2009 | Krueger et al. | 717/107 |
| 8,156,470 | B2* | 4/2012 | Krueger et al. | 717/107 |
| 2005/0096037 | A1* | 5/2005 | Haberman et al. | 455/422.1 |
| 2006/0129418 | A1* | 6/2006 | Lee et al. | 705/1 |
| 2006/0136864 | A1* | 6/2006 | Choi et al. | 717/104 |
| 2007/0180424 | A1* | 8/2007 | Kazakov et al. | 717/104 |
| 2008/0162212 | A1* | 7/2008 | Clayton et al. | 705/7 |
| 2008/0215393 | A1* | 9/2008 | Bruegge et al. | 705/7 |

OTHER PUBLICATIONS

Diaz-Herrera et al, "Aspect-Oriented UML Modeling for Developing Embedded Systems product lines," SPSU, Jan. 31, 2000.*
Riebisch et al., "Modeling Variability for Object-Oriented Product Lines," Springer Berlin/Heidelberg, Jun. 8, 2004.*
Myllymaki, "Variability Management in Software Product Lines," TUT, Mar. 12, 2001.*
Zhang et al., "XVCL: a mechanism for handling variants in software product lines," Jul. 24, 2004.*
"Software Variability Management Workshop", Feb. 13-14, 2003 Jilles Van Gurp & jan Bosch, Feb. 2003.*
Robak et al., "Extending the UML for Modelling Variability for System Families," AMCS, 2002.*
Trigaux et al., "Software Product Lines: State of the art," Sep. 15, 2003.*
Ziadi et al., "Product Line Derivation with UML," 2003.*
Ziadi et al., "Towards a UML profile for software product lines," 2003.*
"Cardinality-Based Feature Modeling and Model-Driven Engineering: Fitting them Together" by Abel Gómez and Isidro Ramos, In proceeding of: Fourth International Workshop on Variability Modelling of Software-Intensive Systems, Linz, Austria, Jan. 27-29, 2010.*
"Cardinality-dependent Variability in Orthogonal Variability Models" by Hans Martin Mærsk-Møller and Bo Nørregaard Jørgensen, VaMoS'12, Jan. 25-27, 2012, Leipzig, Germany.*

(Continued)

*Primary Examiner* — Henry Tsai
*Assistant Examiner* — Jing-Yih Shyu
(74) *Attorney, Agent, or Firm* — Daniel Kliger (57) ABSTRACT

Methods and systems are provided for adding variability support for a modeling language. Developers may utilize the added support to transform a model written in a preexisting domain-specific modeling language for product line development in which there is structural and configurational diversity. A variability layer is incorporated into the model, which permits product developers to better use the language to model product line variants.

16 Claims, 5 Drawing Sheets

(56) References Cited

OTHER PUBLICATIONS

B. Schatz, "Combining Product Lines and Model-Based Development", Electronic Notes in Theoretical Computer Science, vol. 182, Jun. 2007, 171-186.

I. Groher et al., "Expressing Feature-Based Variability in Structural Models", (Source:http://www.voelter.de/data/workshop/MVSPL_GroherVoelter.pdf), Oct. 11, 2007.

Q. Lan et al., "Research on Variability Metamodeling Method", 1st International Symposium on Pervasive Computing and Applications, 2006, pp. 861-865.

R. van Ommering et al, "*Koala, a Component Model for Consumer Electronics Product Software*", , published by Philips Research, Eindhoven, The Netherlands, 1998.

K. Czarnecki et al. "*Cardinality-Based Feature Modeling and Constraints: A Progress Report*", OOPSLA-2005.

* cited by examiner

VARIABILITY LAYER FOR DOMAIN-SPECIFIC MODELING LANGUAGES

BACKGROUND OF THE INVENTION

1. Field of the Invention

This invention relates to modeling technology. More particularly, this invention relates to modeling subjects having diverse structural and configurational variants.

2. Description of the Related Art

The meanings of certain acronyms and abbreviations used herein are given in Table 1.

TABLE 1

Acronyms and Abbreviations

| | |
|---|---|
| DSL | Domain-Specific Language |
| EMF | Eclipse Modeling Framework |
| MOF | Meta Object Facility |
| OCL | Object Constraint Language |
| UML | Unified Modeling Language |

Modeling languages are used to create a visual representation, known as a modeling diagram of a complex system. A well known general-purpose modeling language is Uniform Modeling Language (UML). In general, such languages deal with objects having a set of properties related to the system being modeled. The model represents relationships between the objects and their respective properties and behavior. Such objects may also be referred to as entities, classes or components.

Modeling languages are now commonly exploited by industry for managing the lifecycle of complex systems. Modeling offers some degree of insulation against "technology churn", i.e., shifts in specifications and configurations of the product during its lifecycle. Modeling diagrams, produced using the modeling languages, are particularly useful during product line development, for example software, systems incorporating software and having mechanical and electrical elements. Such product lines may exhibit considerable diversity in features, functions, and configurations. Modeling diagrams readily reveal common elements among product line variants as well as elements that differ.

General-purpose modeling languages have limitations that have been remedied by the development of domain-specific languages (DSL). DSL languages often borrow their vocabulary from the problem domain of the company producing the system. Such customization is intended to permit developers to concentrate on solving product development problems, rather than dealing with language implementation details and drawbacks. Nevertheless, in practice most product models today do not represent product line variability options, but rather a single product.

One approach to dealing with product line diversity is proposed in the document Koala, a *Component Model for Consumer Electronics Product Software*, R. van Ommering, published by Philips Research, Eindhoven, The Netherlands. A structure being modeled is defined in an architectural language, in which components are independent of configuration. A mechanism is suggested to instantiate components and bind them into configurations, using a late binding approach.

The document *Cardinality-Based Feature Modeling and Constraints: A Progress Report*, K. Czarnecki et al. OOPSLA-2005, proposes dealing with variability using cardinality-based feature modeling, and constraint satisfaction facilities, which are implemented using general-purpose modeling languages. In the modeling process, features with a cardinality having an upper bound larger than one can be cloned during configuration.

SUMMARY OF THE INVENTION

According to disclosed embodiments of the invention, methods and systems are provided for adding variability support for a modeling language. In one embodiment, a "variability layer" is added on top of a preexisting domain-specific modeling language. An advantage of some aspects of the present invention is the ability to better support the development of a product line in which there are variants that result in structural and configurational diversity. As a result, there is no necessity for investing in further development or extensions of the preexisting languages or resorting to less efficient general-purpose modeling languages.

An embodiment of the invention provides a computer-implemented method for modeling, which is carried out by using a modeling language to prepare a first model of a subject, and adding a variability layer of variability elements into the first model to produce a second model. The variability elements have respective configuration conditions. The variability elements are associated with at least a portion of the elements, which are then known as conditional elements, The method is further carried out by evaluating the configuration conditions, and classifying the conditional elements for inclusion in different variants of the subject being modeled responsively to respective evaluations of the configuration conditions of the variability elements associated therewith.

According to an aspect of the method, the modeling language is a domain-specific modeling language.

According to another aspect of the method, the variability elements comprise optional variability elements, and the conditional elements that are associated with ones of the optional variability elements are included in the variants only when the configuration conditions evaluate to true, respectively.

According to an additional aspect of the method, the variability elements comprise alternative variability elements. The method is further carried out by grouping at least a portion of the conditional elements into an alternative group, members of the alternative group being ones of the conditional elements that are associated with the alternative variability elements, and selecting exactly one of the members for inclusion in different ones of the variants.

According to another aspect of the method, the variability elements comprise selective variability elements. The method is further carried out by grouping at least a portion of the conditional elements into a selective group, members of the selective group being ones of the conditional elements that are associated with the selective variability elements, and selecting zero or more of the members for inclusion in different ones of the variants.

According to yet another aspect of the method, the variability elements comprise selective variability elements having cardinality. The method is further carried out by grouping at least a portion of the conditional elements into a selective group, members of the selective group being ones of the conditional elements that are associated with the selective variability elements, and selecting a number of the members for inclusion in different ones of the variants, the number being within the limits of the cardinality of the selective variability elements.

According to a further aspect of the method, the variability elements comprise mutually inclusive variability elements. The method is further carried out by grouping at least a portion of the conditional elements into a mutually inclusive group, members of the mutually inclusive group being ones of the conditional elements that are associated with the mutually inclusive variability elements, and selecting a set of the members for inclusion in different ones of the variants, the set being either (1) all of the members or (2) none of the members.

Another aspect of the method includes specializing the variability elements as a stereotype.

A further aspect of the method includes defining the configuration conditions over multiple constraint variables.

According to a further aspect of the method, the variability layer is implemented by constructing a profile that includes a plurality of stereotypes.

Other embodiments of the invention provide computer software product and apparatus for carrying out the above-described method.

BRIEF DESCRIPTION OF THE DRAWINGS

For a better understanding of the present invention, reference is made to the detailed description of the invention, by way of example, which is to be read in conjunction with the following drawings, wherein like elements are given like reference numerals, and wherein.

DETAILED DESCRIPTION OF THE INVENTION

In the following description, numerous specific details are set forth in order to provide a thorough understanding of the present invention. It will be apparent to one skilled in the art, however, that the present invention may be practiced without these specific details. In other instances, well-known circuits, control logic, and the details of computer program instructions for conventional algorithms and processes have not been shown in detail in order not to obscure the present invention unnecessarily.

Software programming code, which embodies aspects of the present invention, is typically maintained in permanent storage, such as a computer readable medium. In a client/server environment, such software programming code may be stored on a client or a server. The software programming code may be embodied on any of a variety of known tangible media for use with a data processing system, such as a diskette, or hard drive, or CD-ROM. The code may be distributed on such media, or may be distributed to users from the memory or storage of one computer system over a network of some type to storage devices on other computer systems for use by users of such other systems.

System Overview.

Figure 1:
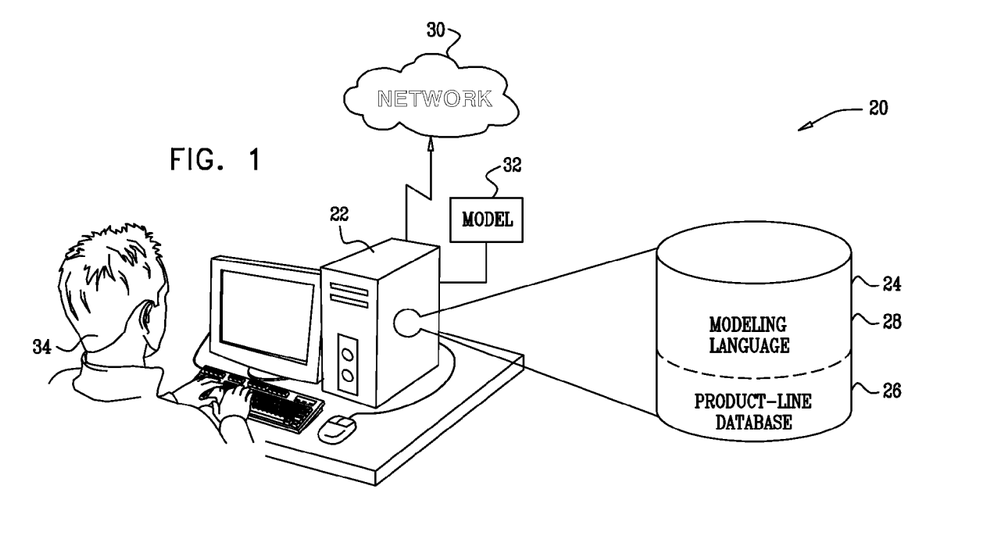
FIG. 1 is a schematic illustration of a modeling system, which is constructed and operative in accordance with a disclosed embodiment of the invention.

Turning now to the drawings, reference is initially made to FIG. 1, which is a schematic illustration of a modeling system 20 for use in product line development, which is constructed and operative in accordance with a disclosed embodiment of the invention.

The system 20 comprises a processor 22 and a memory 24 holding data objects and programs. The system 20 is programmed with suitable software for carrying out the functions described hereinbelow. Thus, although portions of the system 20 are shown as comprising a number of separate functional blocks, these blocks are not necessarily separate physical entities, but rather represent different computing tasks or data objects stored in a memory that is accessible to the processor 22. These tasks may be carried out in software running on a single processor, or on multiple processors. The software may be provided to the processor or processors on tangible media, such as CD-ROM or non-volatile memory. Alternatively or additionally, the system 20 may comprise a digital signal processor or hard-wired logic.

Although the memory 24 is shown in FIG. 1 as a local data store of the computer, the memory may also be maintained at a site remote from the computer, for example, on a server or shared disk system, and accessed by the processor 22 via a network. The memory 24 stores an object that implements a modeling language 28, which the processor 22 is programmed to access and execute, accepting information from a product line database 26. The modeling language 28 typically is a language that has been specialized for the product line under development, i.e., a domain-specific modeling language. In many environments, the processor 22 is linked to other processors and databases (not shown) via a data network 30. However, this is not essential, and the system 20 may be realized as a stand-alone device.

When the system 20 is operated, components of the product line and their properties are extracted from the product line database 26 and relations encoded by an operator 34 using the modeling language 28. The system 20 processes the result to generate a displayable graphical model 32 that describes at least a portion of the product line under development. The model 32 typically depicts a product line, and represents relationships between elements of the product line and their respective properties.

In the context of this disclosure, the model 32 is comprised of elements, which taken together, depict a family of related products. Each element in the model 32 can be classified as mandatory or optional. Elements can be aggregated into element groups. Members of such an element group may be additionally classified as default elements, mandatory elements, or alternative elements within the group.

Element groups include groups of various types, e.g., selective groups with possible cardinality, mutually inclusive groups, and alternative groups.

In a mutually inclusive group all or none of its members may be selected in any product configuration.

Selective groups with possible cardinality group together several elements that have some common usage. If a selective group lacks cardinality, then zero or more elements belonging to the group are chosen for a variant. If the group has cardinality, then the user can select a number of the group elements that conforms to the group cardinality. For example, a selective group can include several personal area networks elements, each supporting different communication protocol such as Bluetooth®, Wi-Fi®, USB, FireWire®. Assume that the group has cardinality of 1 . . . 3. Then, for each product configuration at least one element must be selected and as many as three can be selected.

In an alternative group, exactly one member of the group must be chosen in any particular product configuration.

Whenever an element is optional or belongs to an element group, there is a variability element having a Boolean expression that is attached to it. Such Boolean expressions are termed "configuration conditions". Variability elements attached to alternative conditional elements are termed alternative variability elements. Similar terminology is applied to variability elements associated with other types of conditional elements, e.g., selective variability elements, and mutually inclusive variability elements. It will be seen from the discussion below that this scheme may be implemented by stereotypes. Configuration conditions are defined over configuration variables. Configuration variables drive the configuration of the product line towards the definition of a particular variant. When a product variant is defined, its developers configure the product line model. This may be done directly or indirectly, for example using a feature model. The Boolean expressions that are attached to each model element are evaluated. If an expression evaluates to the value true, its associated element forms part of the defined product, otherwise it is excluded.

In one aspect of the invention, a variability layer is added to a domain-specific modeling language, e.g., a MOF/EMF-based language, that allows a product line developer to classify elements as mandatory or optional, and to group elements (as members of alternative, selective, mutually inclusive groups, etc.). Using the variability layer, an element may be classified as the default element of its group. The variability layer enables configuration variables to be defined and to be assigned to elements of the model. The variability layer also includes constraints that validate the evaluation of an element group, such that the number of selected elements satisfy a group class, e.g., exactly one element is selected in any alternative group.

Profiles adapt modeling languages to specific areas of interest, e.g., business applications, hardware systems. The variability layer can be implemented as a UML profile, typically superimposed on a DSL profile. The variability layer thus extends an existing DSL. It is to be noted that the DSL itself is otherwise unchanged.

Variability Layer.

Figure 2:
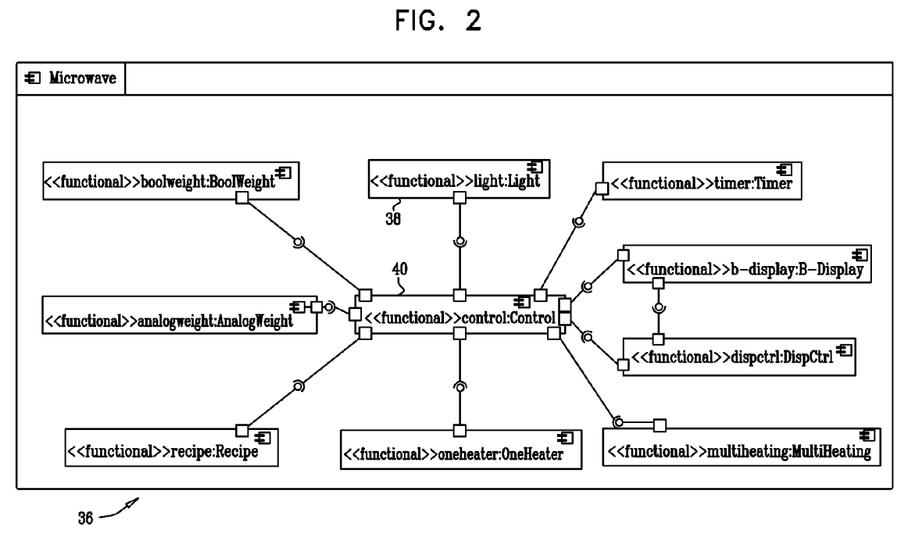
FIG. 2 is a conventional component model diagram of a microwave oven written in a domain-specific modeling language.

Reference is now made to FIG. 2, which is a conventional component model diagram of a microwave oven written in a domain-specific modeling language. A model 36 is written in a conventional domain-specific modeling language. For example, a component 38 (light) interfaces directly with a component 40 (control). There is no provision for variability support in the model 36.

Figure 3:
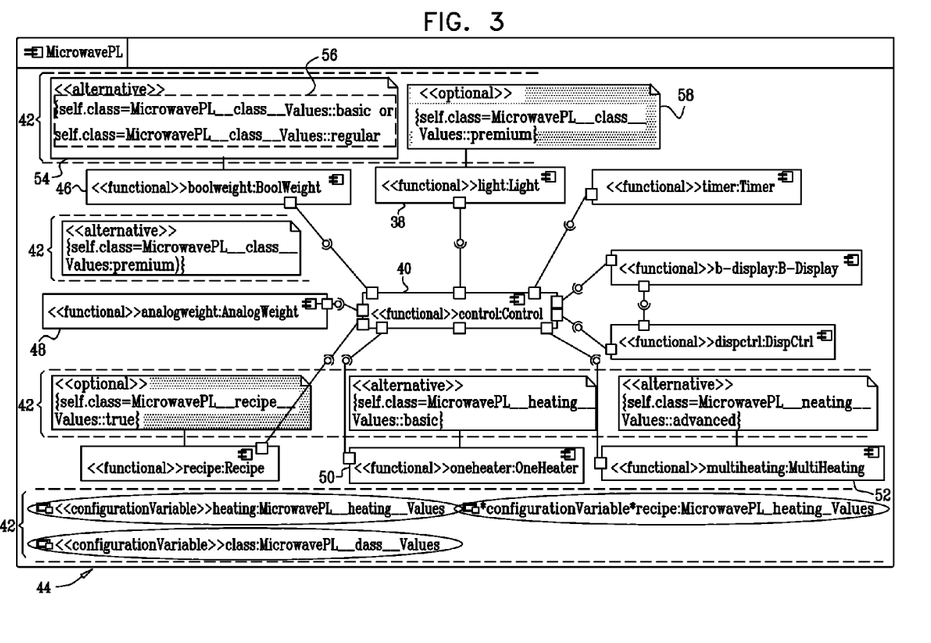
FIG. 3 is a component model diagram of the microwave oven shown in FIG. 2, written in a domain-specific modeling language in accordance with a disclosed embodiment of the invention.

Reference is now made to FIG. 3, which is a component model diagram of the microwave oven shown in FIG. 2, written in a domain-specific modeling language in accordance with a disclosed embodiment of the invention. The domain-specific modeling language used in FIG. 2 has been extended by addition of a variability layer 42 (indicated by variability elements enclosed by broken lines) to produce a model 44. Components are grouped as alternative groups. For example, components 46, 48 form one alternative group of components. Components 50, 52 form a second alternative group. Optional components and alternative components have attached constraints, e.g., the variability layer 42 includes a variability element 54 containing constraint 56 (values basic or regular). The constraint 56 constrains the component 46. The component 38 is optional, being associated with a variability element 58 in the variability layer 42. The component 38 can thus be omitted from a product configuration. Variability stereotypes are discussed in further detail below.

The variability layer 42 allows a product line developer to classify elements as mandatory or optional elements, to group elements, to classify an element as a group's default element, to classify a group as alternative, selective, or mutually inclusive, to define configuration variables and to assign expression conditions to the model elements.

Constraints in the variability layer 42 validate the evaluation of an element group such that the number of selected elements satisfy a group class, e.g., exactly one element is selected in any alternative group.

As noted above, the variability layer 42 does not modify the underlying domain-specific modeling language, but is rather superimposed on it, e.g., as a profile.

Variability Layer Implementation Details

The variability layer can be applied to any MOF/EMF-based domain-specific modeling language. In an original model, the elements are left unchanged while the variability layer is added as a separate layer without otherwise modifying the original model. The original model and the variability layer may be maintained and presented separately.

In one embodiment, the variability layer is implemented as a UML profile. A profile is a group of language constructs called stereotypes. The stereotype is a well-known extension mechanism in UML. While in UML, a stereotype can be applied to model elements, in embodiments of the invention the stereotypes are not applied directly to an original model element. Rather, in order to maintain separation of the variability layer from the original model elements, variability stereotypes are applied to constraint elements that are attached to original model elements.

Configuration Condition.

"Configuration condition" is an abstract class that is represented by the abstract <<configurationCondition>> stereotype, which extends the UML Constraint metaclass.

For any DSL that uses the variability layer, configuration conditions are attached to model elements, e.g., classes, components, connectors, ports, interfaces. These are then known as "conditional elements", meaning that their presence in the model is conditional. There are several types of configuration conditions: optional configuration conditions, alternative configuration conditions, selective configuration conditions, and mutually inclusive configuration conditions.

In UML2, the current version of UML, a constraint is a condition (a Boolean expression) that restricts the extension of the associated element beyond what is imposed by other language constructs applied to that element. Thus, UML2 Constraints are chosen to represent configuration conditions.

Configuration conditions are defined over configuration variables, and they hold a condition. If the condition evaluates to 'true', the constraint element is included in the model. Otherwise, the element is excluded from the model. For example, Configuration conditions may be represented by OCL constraints Since a single OCL constraint can express even a complex condition over multiple configuration variables, instead of attaching a set of simple conditions to each conditional element, one may attach a single complex configuration condition to a conditional element.

Optional Configuration Condition

An optional configuration condition is represented by an <<optional>> stereotype, which specializes the <<configurationCondition>> stereotype defined above. An element constrained by an optional configuration condition in the variability layer is included in a model if and only if the attached configuration condition evaluates to the value 'true'.

Alternative Configuration Condition

An alternative configuration condition is represented by the <<alternative>> stereotype, which specializes the <<configurationCondition>> stereotype.

Alternative configuration condition constraints can be attached to element that belongs to a group of alternative elements (usually alternative sub-components, ports or connectors). Each alternative group is given a unique group identifier in order to identify all elements that compose the group. The group identifier is represented by a groupID attribute, which is added to the <<alternative>> stereotype. One and only one element from a set of alternatives can be selected. The selection is based on a configuration condition attached to the elements. Selective and mutually inclusive groups are implemented in a similar manner.

Configuration Variable

A configuration variable is represented by the <<configurationVariable>> stereotype, which extends the UML Property metaclass. The type of the property that represents a configuration variable should be one of the following UML types: UMLPrimitiveType String, UMLPrimitiveType Integer or UML2 Enumeration.

In UML2, an enumeration is an object that contains a number of user-defined enumeration literals. For configuration variables, enumeration literals represent the set of allowed configuration values. A default configuration value is defined using defaultvalue meta-association of the Property class).

Configuration Value

A configuration value is represented by the <<configurationValue>> stereotype, which extends the UML EnumerationLiteral metaclass.

Use Cases.

Figure 4:
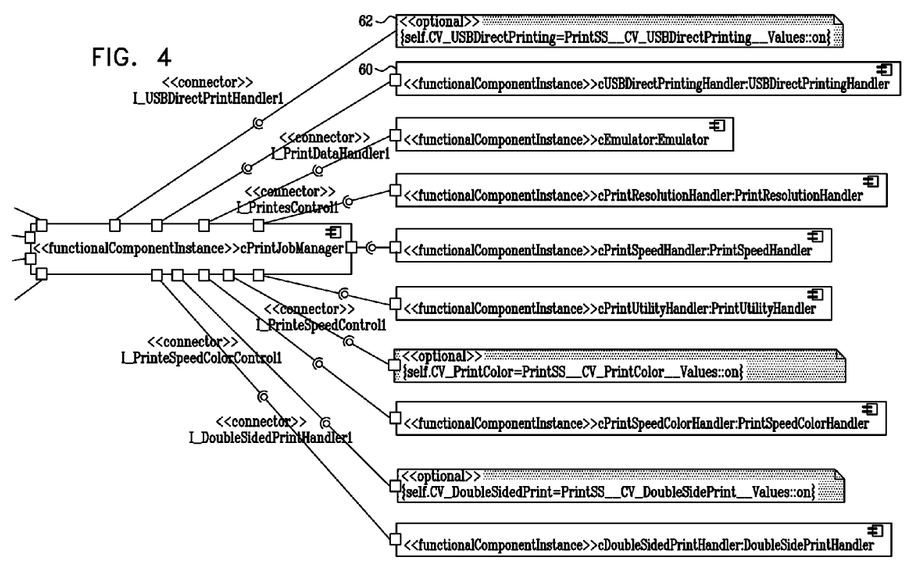
FIG. 4 illustrates DSL elements in association with elements of a variability layer, in accordance with a disclosed embodiment of the invention.

Reference is now made to FIG. 4, which illustrates DSL elements in association with elements of a variability layer, in accordance with a disclosed embodiment of the invention. In this example, some elements are modeled using a conventional DSL and are of a type "FunctionalComponentInstance". These are attached to variability layer elements as constraints of type "optional", making the original elements optional in this configuration. For example, conventional element 60 is attached to variability layer element 62.

Figure 5:
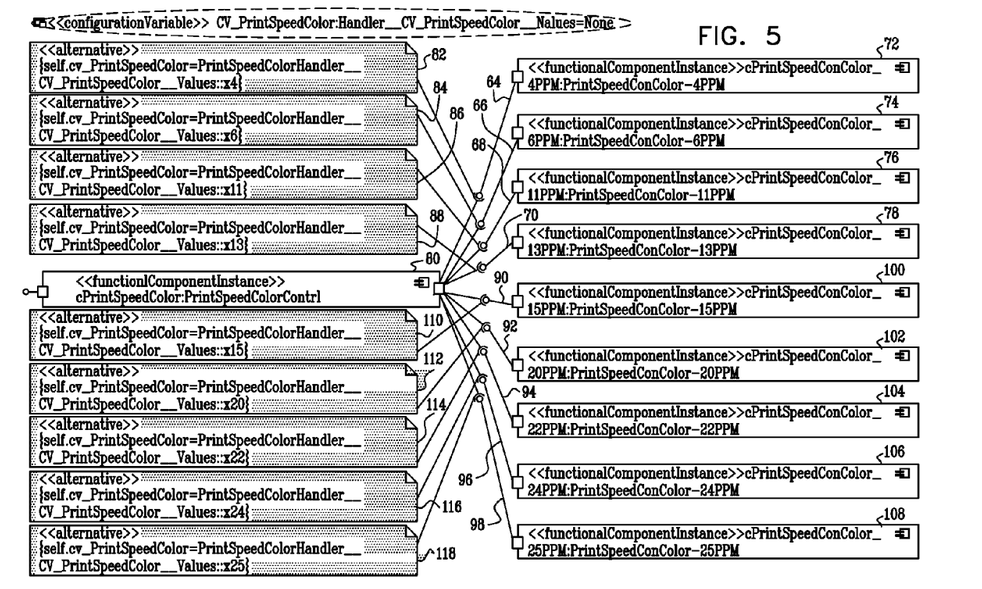
FIG. 5 is a component diagram having DSL elements in accordance with a disclosed embodiment of the invention.

Reference is now made to FIG. 5, which a component diagram having DSL elements of type functionalComponentInstance, in accordance with a disclosed embodiment of the invention. In this example, dealing with different components of a printer product line, the variability layer is used to specify alternative possibilities among the DSL elements and is represented by variability layer elements of type "alternative". Every alternative connector has an attached variability constraint. Accordingly, only one of the DSL elements is allowed in any given configuration.

In the upper portion of FIG. 5, connectors 64, 66, 68, 70 respectively attach DSL elements 72, 74, 76, 78 to a control element 80. Variability constraints 82, 84, 86, 88 relate to the connectors 64, 66, 68, 70, respectively.

Similarly, in the lower portion of FIG. 5, connectors 90, 92, 94, 96, 98 respectively attach DSL elements 100, 102, 104, 106, 108 to the control element 80. Variability constraints 110, 112, 114, 116, 118 relate to the connectors 90, 92, 94, 96, 98, respectively. Only one of the nine noted alternative DSL elements 72, 74, 76, 78, 100, 102, 104, 106, 108 can be used in any particular configuration of the printer.

It will be appreciated by persons skilled in the art that the present invention is not limited to what has been particularly shown and described hereinabove. Rather, the scope of the present invention includes both combinations and subcombinations of the various features described hereinabove, as well as variations and modifications thereof that are not in the prior art, which would occur to persons skilled in the art upon reading the foregoing description.

The invention claimed is:

1. A computer-implemented method for modeling, comprising the steps of:
    using a domain specific modeling language to prepare a first model of a subject, the subject having variants, said first model comprising elements, wherein;
    creating a second model of the subject that comprises a variability layer having variability elements, the variability elements having respective configuration conditions linked thereto, the configuration conditions comprising Boolean expressions,
    adding the second model to the first model as a separate layer on the first model to thereby produce a combined model by attaching said variability elements to at least a portion of said elements of said first model, wherein the elements of the first model are unchanged by the step of adding the second model;
    implementing an instance of the combined model by assigning respective constraint values to the configuration conditions;
    making respective evaluations of the configuration conditions of said variability elements in the combined model; and
    classifying said variability elements for inclusion in different ones of said variants responsively to the respective evaluations of said configuration conditions.

2. The method according to claim 1, wherein said variability elements of the second model comprise at least one of: an optional variability element, which is included in the variants only when the respective configuration condition linked thereto evaluates to a Boolean value True;
    alternative variability elements, wherein exactly one of the alternative variability elements is included in the variants when the configuration condition linked thereto evaluates to the Boolean value True;
    selective variability elements, wherein zero or more of the selective variability elements are included in the variants when the respective configuration condition linked thereto evaluates to the Boolean value True;
    cardinality-based selective variability elements cardinality upper bound, wherein a number of the cardinality-based selective variability elements are included in the variants when the respective configuration condition linked thereto evaluates to the Boolean value True, and wherein the number is no greater than the cardinality upper bound; and
    mutually inclusive variability elements, wherein a set of the mutually inclusive variability elements are included in the variants, the set being selected from a first subset consisting of none of the mutually inclusive variability elements and a second subset consisting of all of the mutually inclusive variability elements.

3. The method according to claim 1, wherein said variability elements of the second model comprise an optional variability element, which is included in the variants only when the respective configuration condition linked thereto evaluates to a Boolean value True;
    alternative variability elements, wherein exactly one of the alternative variability elements is included in the variants when the configuration condition linked thereto evaluates to the Boolean value True;

selective variability elements, wherein zero or more of the selective variability elements are included in the variants when the respective configuration condition linked thereto evaluates to the Boolean value True;

cardinality-based selective variability elements cardinality upper bound, wherein a number of the cardinality-based selective variability elements are included in the variants when the respective configuration condition linked thereto evaluates to the Boolean value True, and wherein the number is no greater than the cardinality upper bound; and mutually inclusive variability elements, wherein a set of the mutually inclusive variability elements are included in the variants, the set being selected from a first subset consisting of none of the mutually inclusive variability elements and a second subset consisting of all of the mutually inclusive variability elements.

4. The method according to claim 1, further comprising the step of specializing said variability elements as a stereotype, said stereotype being constructed in said separate layer.

5. The method according to claim 1, wherein assigning respective constraint values further comprises the step of defining said configuration conditions over multiple constraint variables.

6. The method according to claim 1, wherein adding the second model comprises constructing a profile, said profile comprising a plurality of stereotypes, said stereotypes being constructed in said separate layer.

7. A computer software product for modeling, including a computer storage medium in which computer program instructions are stored, which instructions, when executed by a computer, cause the computer to perform the steps of:

using a domain specific modeling language to prepare a first model of a subject, the subject having variants, said first model comprising elements, wherein;

creating a second model of the subject that comprises a variability layer having variability elements, the variability elements having respective configuration conditions linked thereto, the configuration conditions comprising Boolean expressions, adding the second model to the first model as a separate layer on the first model to thereby produce a combined model by attaching said variability elements to at least a portion of said elements of said first model, wherein the elements of the first model are unchanged by the step of adding the second model;

implementing an instance of the combined model by assigning respective constraint values to the configuration conditions;

making respective evaluations of the configuration conditions of said variability elements in the instance of the combined model;

and classifying said variability elements for inclusion in different ones of said variants responsively to the respective evaluations of said configuration conditions.

8. The computer software product according to claim 7, wherein said variability elements of the second model comprise at least one of an optional variability element, which is included in the variants only when the respective configuration condition linked thereto evaluates to a Boolean value True;

alternative variability elements, wherein exactly one of the alternative variability elements is included in the variants when the configuration condition linked thereto evaluates to the Boolean value True;

selective variability elements, wherein zero or more of the selective variability elements are included in the variants when the respective configuration condition linked thereto evaluates to the Boolean value True;

cardinality-based selective variability elements cardinality upper bound, wherein a number of the cardinality-based selective variability elements are included in the variants when the respective configuration condition linked thereto evaluates to the Boolean value True, and wherein the number is no greater than the cardinality upper bound; and mutually inclusive variability elements, wherein a set of the mutually inclusive variability elements are included in the variants, the set being selected from a first subset consisting of none of the mutually inclusive variability elements and a second subset consisting of all of the mutually inclusive variability elements.

9. The computer software product according to claim 7, wherein said variability elements of the second model comprise an optional variability element, which is included in the variants only when the respective configuration condition linked thereto evaluates to a Boolean value True;

alternative variability elements, wherein exactly one of the alternative variability elements is included in the variants when the configuration condition linked thereto evaluates to the Boolean value True;

selective variability elements, wherein zero or more of the selective variability elements are included in the variants when the respective configuration condition linked thereto evaluates to the Boolean value True;

cardinality-based selective variability elements cardinality upper bound, wherein a number of the cardinality-based selective variability elements are included in the variants when the respective configuration condition linked thereto evaluates to the Boolean value True, and wherein the number is no greater than the cardinality upper bound; and mutually inclusive variability elements, wherein a set of the mutually inclusive variability elements are included in the variants, the set being selected from a first subset consisting of none of the mutually inclusive variability elements and a second subset consisting of all of the mutually inclusive variability elements.

10. The computer software product according to claim 7, wherein said computer is further instructed to incorporate said variability layer as a profile, said profile comprising a plurality of stereotypes, said stereotypes being constructed in said separate layer.

11. A computer-implemented method for modeling, comprising the steps of:

using a domain specific modeling language to prepare a first model of a subject, the subject having variants, said first model comprising elements, wherein the first model lacks provision for variability support;

creating a second model of the subject that comprises a variability layer having variability elements, the variability elements having respective configuration conditions linked thereto, the configuration conditions comprising Boolean expressions, adding the second model to the first model as a separate layer on the first model to thereby produce a combined model by attaching said variability elements to at least a portion of said elements of said first model, wherein the elements of the first model are unchanged by the step of adding the second model;

implementing an instance of the combined model by assigning respective constraint values to the configuration conditions;

making respective evaluations of the configuration conditions of said variability elements in the combined model; and classifying said variability elements for inclusion in different ones of said variants responsively to the respective evaluations of said configuration conditions.

12. The method according to claim 11, wherein said variability elements comprise at least one of:

an optional variability element, which is included in the variants only when the respective configuration condition linked thereto evaluates to a Boolean value True;

alternative variability elements, wherein exactly one of the alternative variability elements is included in the variants when the configuration condition linked thereto evaluates to the Boolean value True;

selective variability elements, wherein zero or more of the selective variability elements are included in the variants when the respective configuration condition linked thereto evaluates to the Boolean value True;

cardinality-based selective variability elements cardinality upper bound, wherein a number of the cardinality-based selective variability elements are included in the variants when the respective configuration condition linked thereto evaluates to the Boolean value True, and wherein the number is no greater than the cardinality upper bound; and mutually inclusive variability elements, wherein a set of the mutually inclusive variability elements are included in the variants, the set being selected from a first subset consisting of none of the mutually inclusive variability elements and a second subset consisting of all of the mutually inclusive variability elements.

13. A computer-implemented method for modeling, comprising the steps of:

using a domain specific modeling language to prepare a first model of a subject, the subject having variants, the first model comprising elements, wherein the first model lacks provision for variability support;

creating a second model of the subject that comprises a variability layer having variability elements, the variability elements having respective configuration conditions linked thereto, the configuration conditions comprising Boolean expressions, wherein the variability elements comprise:

an optional variability element, which is included in the variants only when the respective configuration condition linked thereto evaluates to a Boolean value True;

alternative variability elements, wherein exactly one of the alternative variability elements is included in the variants when the configuration condition linked thereto evaluates to the Boolean value True;

selective variability elements, wherein zero or more of the selective variability elements are included in the variants when the respective configuration condition linked thereto evaluates to the Boolean value True;

cardinality-based selective variability elements cardinality upper bound, wherein a number of the cardinality-based selective variability elements are included in the variants when the respective configuration condition linked thereto evaluates to the Boolean value True, and wherein the number is no greater than the cardinality upper bound; and mutually inclusive variability elements, wherein a set of the mutually inclusive variability elements are included in the variants, the set being selected from a first subset consisting of none of the mutually inclusive variability elements and a second subset consisting of all of the mutually inclusive variability elements;

adding the second model to the first model as a separate layer on the first model to thereby produce a combined model by attaching the variability elements to at least a portion of the elements of the first model as conditional elements, wherein the elements of the first model are unchanged by the step of adding the second model;

in an instance of the combined model assigning respective constraint values to the configuration conditions;

making respective evaluations of the configuration conditions of the variability elements in the instance of the combined model; and classifying the conditional elements for inclusion in different ones of the variants responsively to the respective evaluations of the configuration conditions.

14. The method according to claim 13, further comprising the step of specializing the variability elements as a stereotype, the stereotype being constructed in the separate layer.

15. The method according to claim 13, wherein assigning respective constraint values further comprises the step of defining the configuration conditions over multiple constraint variables.

16. The method according to claim 13, wherein adding the second model comprises constructing a profile, the profile comprising a plurality of stereotypes, the stereotypes being constructed in the separate layer.

* * * * *